United States Patent
Wang et al.

(10) Patent No.: US 11,581,861 B2
(45) Date of Patent: Feb. 14, 2023

(54) CAPACITANCE DECREASING SCHEME FOR OPERATIONAL AMPLIFIER

(71) Applicant: NOVATEK Microelectronics Corp., Hsin-Chu (TW)

(72) Inventors: Ying-Hsiang Wang, New Taipei (TW); Tsung-Hau Chang, Hsinchu (TW); Jung-Hsing Liao, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 36 days.

(21) Appl. No.: 16/935,174

(22) Filed: Jul. 21, 2020

(65) Prior Publication Data
US 2021/0050830 A1 Feb. 18, 2021

Related U.S. Application Data

(60) Provisional application No. 62/888,535, filed on Aug. 18, 2019.

(51) Int. Cl.
*H03F 3/45* (2006.01)

(52) U.S. Cl.
CPC ..... *H03F 3/45179* (2013.01); *H03F 3/45632* (2013.01)

(58) Field of Classification Search
CPC ............ H03F 3/45179; H03F 3/45632; H03F 3/45475; H03F 3/45183; H03F 1/0205; H03M 1/661; H03M 1/765; H03M 1/78; H03M 1/808
USPC .................................................. 330/252–261
See application file for complete search history.

(56) References Cited

U.S. PATENT DOCUMENTS

| | | |
|---|---|---|
| 5,883,535 A | 3/1999 | Kato |
| 6,448,836 B2 | 9/2002 | Kokubun |
| 7,005,916 B2 * | 2/2006 | Nakahira ............. G09G 3/3696 330/51 |
| 2009/0140802 A1 | 6/2009 | Kitagawa |
| 2013/0015991 A1 | 1/2013 | Cheeranthodi |
| 2014/0347129 A1 * | 11/2014 | Toyotaka ............ H03F 3/45071 330/253 |
| 2016/0248380 A1 | 8/2016 | Lee |

FOREIGN PATENT DOCUMENTS

| | | |
|---|---|---|
| TW | I681629 B | 1/2020 |
| WO | 2016/137928 A1 | 9/2016 |

* cited by examiner

*Primary Examiner* — Hafizur Rahman
*Assistant Examiner* — Khiem D Nguyen
(74) *Attorney, Agent, or Firm* — Winston Hsu

(57) ABSTRACT

An operational amplifier includes a first differential input pair, a first switch and a second switch. The first differential input pair includes a first input transistor and a second input transistor. The first input transistor has a gate terminal coupled to an output terminal of the operational amplifier. The second input transistor has a gate terminal. The first switch is coupled between the gate terminal of the first input transistor and the gate terminal of the second input transistor. The second switch is coupled between a first input terminal of the operational amplifier and the gate terminal of the second input transistor.

13 Claims, 17 Drawing Sheets

US 11,581,861 B2

CAPACITANCE DECREASING SCHEME FOR OPERATIONAL AMPLIFIER

CROSS REFERENCE TO RELATED APPLICATIONS

This application claims the benefit of U.S. Provisional Application No. 62/888,535, filed on Aug. 18, 2019, the contents of which are incorporated herein by reference.

BACKGROUND OF THE INVENTION

1. Field of the Invention

The present invention relates to an operational amplifier, and more particularly, to an operational amplifier for a source driver of a panel.

2. Description of the Prior Art

An operational amplifier is a basic circuit component frequently used in analog integrated circuits (ICs) such as a source driver or data driver of a panel. Under the design and application for high resolution and low offset (i.e., small deviation of data voltage) source driver IC, the single-stage operational amplifier, which is used as an output buffer in the conventional source driver circuit (abbreviated as a source operational amplifier, S-OP, hereinafter), have complied with both the bandwidth and speed requirements. However, due to excessively large parasitic capacitance in the input pair(s) of the S-OP, a bottleneck is generated such that the output speed of the S-OP cannot be increased. This bottleneck is mainly caused by the RC delay generated from the output terminal of the digital-to-analog converter (DAC) to the input terminal of the S-OP.

Please refer to FIG. 1, which is a schematic diagram of a source driver circuit 10. FIG. 1 illustrates the circuitry between an output buffer of a Gamma voltage generation circuit and the S-OP. The output buffer of the Gamma voltage generation circuit is usually implemented with an operational amplifier, and thus called an input Gamma operational amplifier (IGOP). Seven tap voltages Gamma1-Gamma7 generated from the IGOP are further divided by the Gamma resistors to generate multiple Gamma voltages to be outputted to the resistor-ladder DAC (RDAC). According to the input image data (e.g., an 8-bit code or 10-bit code), the RDAC selects a Gamma voltage corresponding to the input image data from multiple Gamma voltages to be transmitted to the input terminal of the S-OP. The RDAC may include multiple switches, which are controlled by control signal(s) corresponding to the input image data. Several of the switches are turned on when the RDAC performs voltage selection. The time delay of RC charging and discharging (RC delay) is generated with the impedance (i.e., Ron) formed in a series of conducted paths together with the parasitic capacitance of the differential input pair(s) of the S-OP and the parasitic capacitance on the paths. This RC delay will severely limit signal propagation of the overall source driver IC system under high resolution.

In order to decrease the time delay generated in the circuit from the RDAC to the input pair of S-OP, several simple solutions are to reduce the turned-on impedance of the switches in the RDAC or reduce the number of resistors in the resistor string. However, when the RDAC or the resistor string is extremely simplified, larger time delay may be generated in the applications of higher resolution.

Please refer to FIG. 2, which illustrates multiple differential input pairs in an input stage circuit 200 of a conventional S-OP. The multiple differential input pairs are served to generate finer input data voltage levels through interpolation, to increase the resolution of data voltage outputted by the S-OP. For example, if 8-bit resolution has to be provided, a 6-bit DAC with a 2-bit S-OP may be utilized. In an exemplary structure such as a DDA (differential difference amplifier), multiple differential input pairs are composed of multiple metal-oxide semiconductor field-effect transistors (MOSFETs) coupled to multiple current sources (receiving the bias voltage VB). Different differential input pairs may receive slightly different input data voltages (e.g., the input data voltages Vin1+, Vin1−, Vin2+, Vin2−, Vin3+, Vin3− . . . . etc. as shown in FIG. 2) to achieve the interpolation. When the system has requirements of higher color resolution (e.g., from 8-bit to 10-bit or even 12-bit), lower deviation of data voltage is also necessary. However, the area of differential input pairs of the S-OP may rise rapidly. For example, in the DDA structure, the circuit area of the differential input pairs may be expanded by 4 times (and the parasitic capacitance also increases with the same ratio) when the resolution increases by 2 bits, which causes that the parasitic capacitance at the output terminal of the RDAC rises by multiple times, resulting in larger delay on the input signal of the S-OP.

SUMMARY OF THE INVENTION

It is therefore an objective of the present invention to provide a capacitance decreasing scheme for an operational amplifier of a source driver, in order to solve the above-mentioned problems.

An embodiment of the present invention discloses an operational amplifier, which comprises a first differential input pair, a first switch and a second switch. The first differential input pair comprises a first input transistor and a second input transistor. The first input transistor has a gate terminal coupled to an output terminal of the operational amplifier. The second input transistor has a gate terminal. The first switch is coupled between the gate terminal of the first input transistor and the gate terminal of the second input transistor. The second switch is coupled between a first input terminal of the operational amplifier and the gate terminal of the second input transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
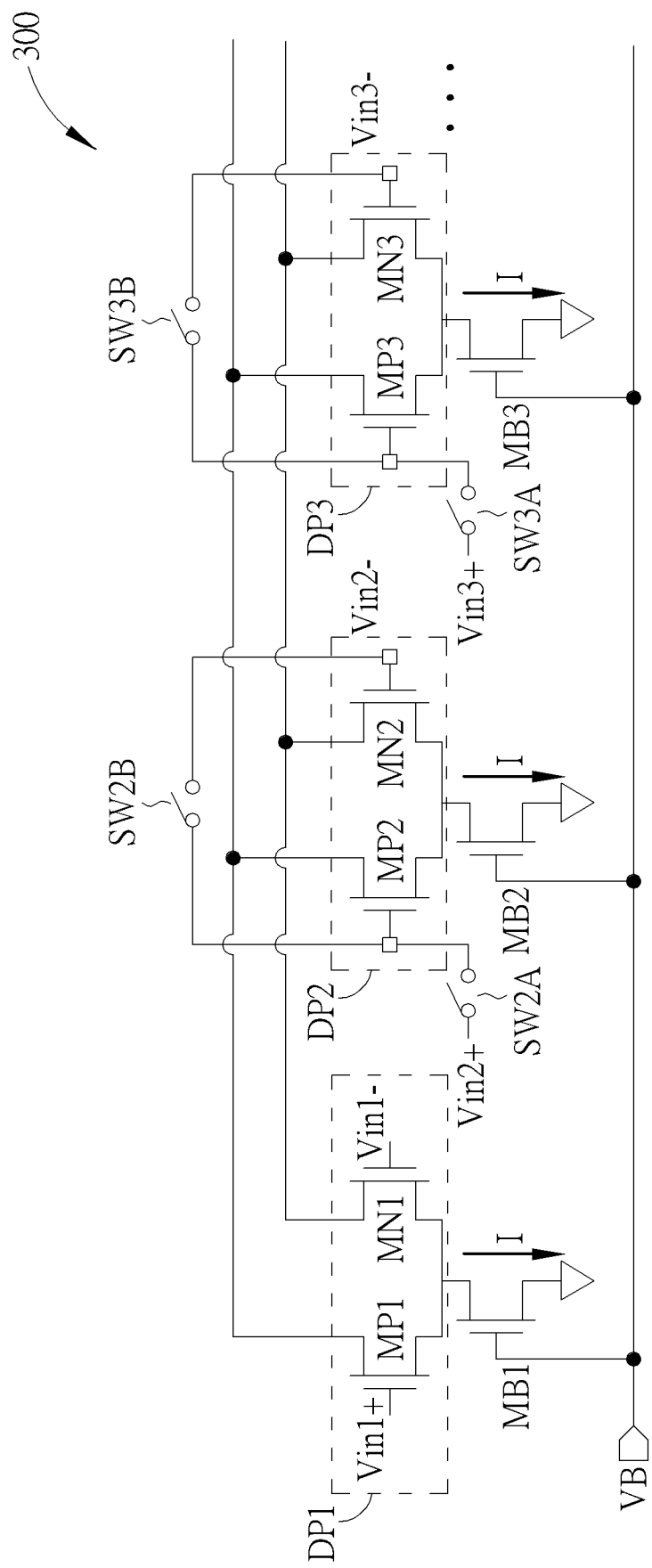
FIG. 3 is a schematic diagram of an input stage circuit of an operational amplifier according to an embodiment of the present invention.

Please refer to FIG. 3, which is a schematic diagram of an input stage circuit 300 of an operational amplifier according to an embodiment of the present invention. As shown in FIG. 3, the input stage circuit 300 includes multiple differential input pairs, among which three differential input pairs DP1-DP3 are shown. The differential input pair DP1, composed of input transistors MP1 and MN1, is operated by receiving current supply from a current source implemented with a transistor MB1. The differential input pair DP2, composed of input transistors MP2 and MN2, is operated by receiving current supply from a current source implemented with a transistor MB2. The differential input pair DP3, composed of input transistors MP3 and MN3, is operated by receiving current supply from a current source implemented with a transistor MB3. The transistors MB1-MB3 are configured to supply bias currents (or called tail currents) by receiving a bias voltage VB. In this embodiment, each differential input pair DP1-DP3 receives the same bias current value I. Similar to the input stage circuit 200, the differential input pairs of the input stage circuit 300 are respectively configured to receive slightly different input data voltages Vin1+, Vin1−, Vin2+, Vin2−, Vin3+, Vin3− . . . etc. to perform interpolation for outputting a desired voltage level with higher resolution.

As shown in FIG. 3, the input stage circuit 300 further includes a switch SW2A coupled between the gate terminal of the input transistor MP2 and a positive input terminal (that receives the input data voltage Vin2+) of the operational amplifier, a switch SW2B coupled between the gate terminal of the input transistor MP2 and the gate terminal of the input transistor MN2, a switch SW3A coupled between the gate terminal of the input transistor MP3 and another positive input terminal (that receives the input data voltage Vin3+) of the operational amplifier, and a switch SW3B coupled between the gate terminal of the input transistor MP3 and the gate terminal of the input transistor MN3.

Figure 4:
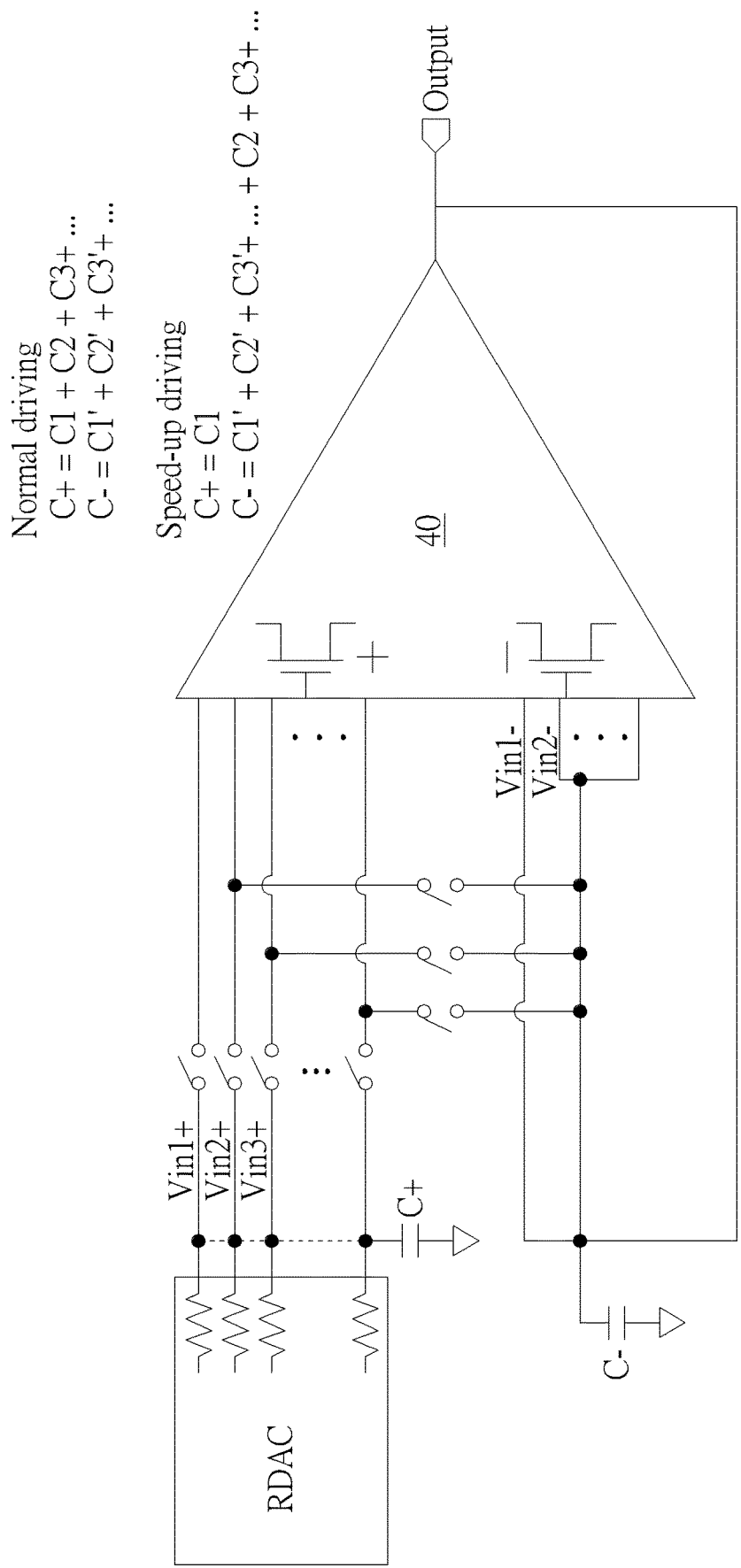
FIG. 4 shows an exemplary S-OP having multiple positive input terminals and multiple negative input terminals.

If the operational amplifier is used as an output buffer of the source driver (abbreviated as a source operational amplifier, S-OP, hereinafter), the operational amplifier may be coupled to the resistor-ladder digital-to-analog converter (RDAC) in the Gamma voltage generation circuit. More specifically, the positive input terminals of the S-OP may be coupled to the RDAC, and the negative input terminals of the S-OP may be coupled to the output terminal of the S-OP to form the buffer structure. FIG. 4 shows an exemplary S-OP 40 having multiple positive input terminals and multiple negative input terminals, where at least one positive input terminal is configured to be coupled to the output terminal of the RDAC, and all of the negative input terminals are coupled to the output terminal of the S-OP 40 itself.

Please refer back to FIG. 3. Each of the differential input pairs DP2 and DP3 of the input stage circuit 300 may operate in two different driving modes based on controls of the switches. As for the differential input pair DP2, in a normal driving mode (first driving mode), the switch SW2A may be turned on and the switch SW2B may be turned off, so that the gate terminal of the input transistor MP2 may be coupled to the input terminal of the S-OP, to be further coupled to the RDAC; in a speed-up driving mode (second driving mode), the switch SW2A may be turned off and the switch SW2B may be turned on, so that the gate terminal of the input transistor MP2 may be coupled to the gate terminal of the input transistor MN2. In addition, the switches SW3A and SW3B may be operated in a manner similar to the switches SW2A and SW2B, in order to realize the driving modes of the differential input pair DP3, and the related operations will be omitted herein.

Therefore, in the speed-up driving mode, the gate terminal of the positive input transistor of several differential input pairs (i.e., DP2 and DP3) is coupled to the gate terminal of the corresponding negative input transistor, and the connections between the gate terminal of the positive input transistor of these differential input pairs and the input terminal of the S-OP are cut off. In such a configuration of enabling a less number of differential input pairs of the S-OP, the parasitic capacitance of the differential input pairs of the S-OP may be quickly charged/discharged by the S-OP. Hence, the parasitic capacitance at the output terminal of the RDAC may be significantly reduced, and thus the RC delay phenomenon may be mitigated. In FIG. 3 and the figures of subsequent embodiments, the connections between the negative input terminal of the differential input pairs and the output terminal of the S-OP are omitted, but those skilled in the art should understand that the negative input terminals may be commonly coupled to the output terminal to form the buffer structure based on the circuitry shown in FIG. 4.

During a display line period (or called display output period), a line of new display data are loaded to the operational amplifiers of the source driver, and thus a great number of S-OPs are switched to receive selected data voltages corresponding to the new display data from the RDAC. The data voltages selected by the RDAC may change due to pixel data changes, and hence the input data voltages of the S-OPs go to the steady state after a rising time or a falling time in the display line period. The rising time refers to a period in which the input data voltage of the S-OP changes from a current level to a higher level. The falling time refers to a period in which the input data voltage of the S-OP changes from a current level to a lower level. In this embodiment, the switches SW2A, SW2B, SW3A and SW3B may be operated in the speed-up driving mode which is during a rising time or a falling time of the input data voltage of the S-OP in a display line period. During the rising time and/or falling time of the input data voltage of the S-OP, it is preferable to control more positive gate terminals of the differential input pairs to be coupled to the corresponding negative gate terminals. In detail, the input stage circuit may be configured to that the positive gate terminal of only a group or small minority of differential input pairs is applied to receive the data voltage outputted from the RDAC, and that the positive gate terminal and negative gate terminal of most of the differential input pairs are connected to the output terminal of the S-OP (i.e., the feedback terminal). In the embodiment shown in FIG. 3, the switches SW2A and SW3A may be turned off and the switched SW2B and SW3B may be turned on in the speed-up driving mode; hence, the gate terminal of the positive input transistors MP2 and MP3 is coupled to the gate terminal of the corresponding negative input transistors MN2 and MN3, respectively. The disconnection of the switches SW2A and SW3A reduces the parasitic capacitance at the output terminal of the RDAC, so as to reduce the time delay of signal propagation.

On the other hand, in the normal driving mode, the gate terminal of the positive input transistor of all differential input pairs DP1-DP3 may be coupled to the input terminal of the S-OP, and further coupled to the corresponding output terminal of the RDAC. For example, after the input data voltage of the S-OP is approximately settled (i.e., approaching its target voltage value), the switches SW2A and SW3A may be turned on and the switched SW2B and SW3B may be turned off, allowing the normal driving to control the output terminal of the S-OP to reach the accurate voltage value.

Please continue to refer to FIG. 4 together with FIG. 3. Except for the first differential input pair (e.g., DP1) that receives the input data voltage Vin1+, other differential input pairs (e.g., DP2, DP3 . . . ) are controlled through switches, to be selectively coupled to the corresponding input terminal or the corresponding negative gate terminal in different driving modes. In the normal driving mode where all of the switches coupled between the gate terminal of the positive input transistor and the input terminal of the S-OP 40 are turned on and all of the switches coupled between the gate terminal of the positive input transistor and the gate terminal of the negative input transistor are turned off, the total capacitance observed from the positive input terminals (i.e., C+) may equal C1+C2+C3+ . . . , where C, C2, C3 . . . refer to the parasitic capacitance of each positive input transistor. Meanwhile, the total capacitance observed from the negative input terminals (i.e., C−) may equal C1'+C2'+C3'+ . . . , where C1', C2', C3' . . . refer to the parasitic capacitance of each negative input transistor.

Figure 5:
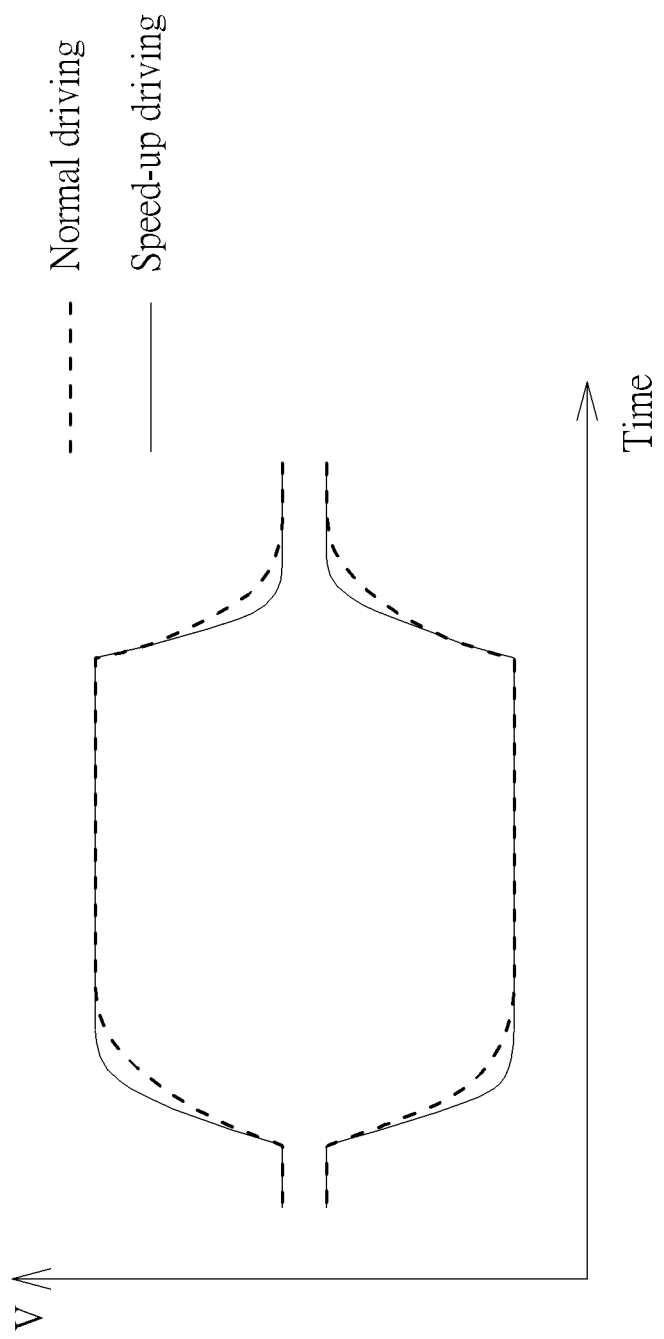
FIG. 5 is a schematic diagram of voltage swings under the normal driving mode and the speed-up driving mode.

In the speed-up driving mode where all of the switches coupled between the gate terminal of the positive input transistor and the gate terminal of the negative input transistor are turned on and all of the switches coupled between the gate terminal of the positive input transistor and the input terminal of the S-OP 40 are turned off, the total capacitance observed from the positive input terminals may include C1 only, while the total capacitance observed from the negative input terminals may increase to C1'+C2'+C3' . . . +C2+C3+ . . . . Since the negative input terminals are commonly coupled to the output terminal of the S-OP 40, the parasitic capacitance of these differential input pairs may be charged or discharged by using strong and powerful push/pull capability of the S-OP 40. Therefore, the parasitic capacitance at the output terminal of the RDAC (which is coupled to only one or few positive input terminals of the S-OP 40) may be significantly reduced. As shown in FIG. 5, with reduced capacitive loading at the output terminal of the RDAC (or the input terminal of the S-OP 40) in the speed-up driving mode, the rising time and falling time of input data voltage may be decreased, which means that the RC delay is decreased.

Please note that which differential input pair is configured to be coupled to the input terminal in the speed-up driving mode is not a limitation of the present invention. In an embodiment, each of the switches in the input stage circuit may be controlled independently and flexibly; hence, there may be an arbitrary number of positive input transistors coupled to the input terminal. In an embodiment, a switch may be disposed between the gate terminal of the positive input transistor and the gate terminal of the negative input transistor and a switch may be disposed between the gate terminal of the positive input transistor and the input terminal in each differential input pair (including the first differential input pair), so that different differential input pairs may be configured to be coupled to the input terminal at different time. For example, during each display line period, one of the differential input pairs may be selected to be coupled to the input terminal and other differential input pairs are coupled as in the speed-up driving mode for reducing the input capacitive loading. Another differential input pair may be selected to be coupled to the input terminal after every N display line periods (which means N consecutive display lines are displayed or N consecutive data voltages are outputted by an S-OP) or after every N consecutive image frames are displayed. This implementation aims at mitigating or canceling the offsets caused by process mismatch between the differential input pairs. Moreover, it is also possible to configure different differential input pairs to be coupled to the input terminal interchangeably in one display line period.

Figure 6:
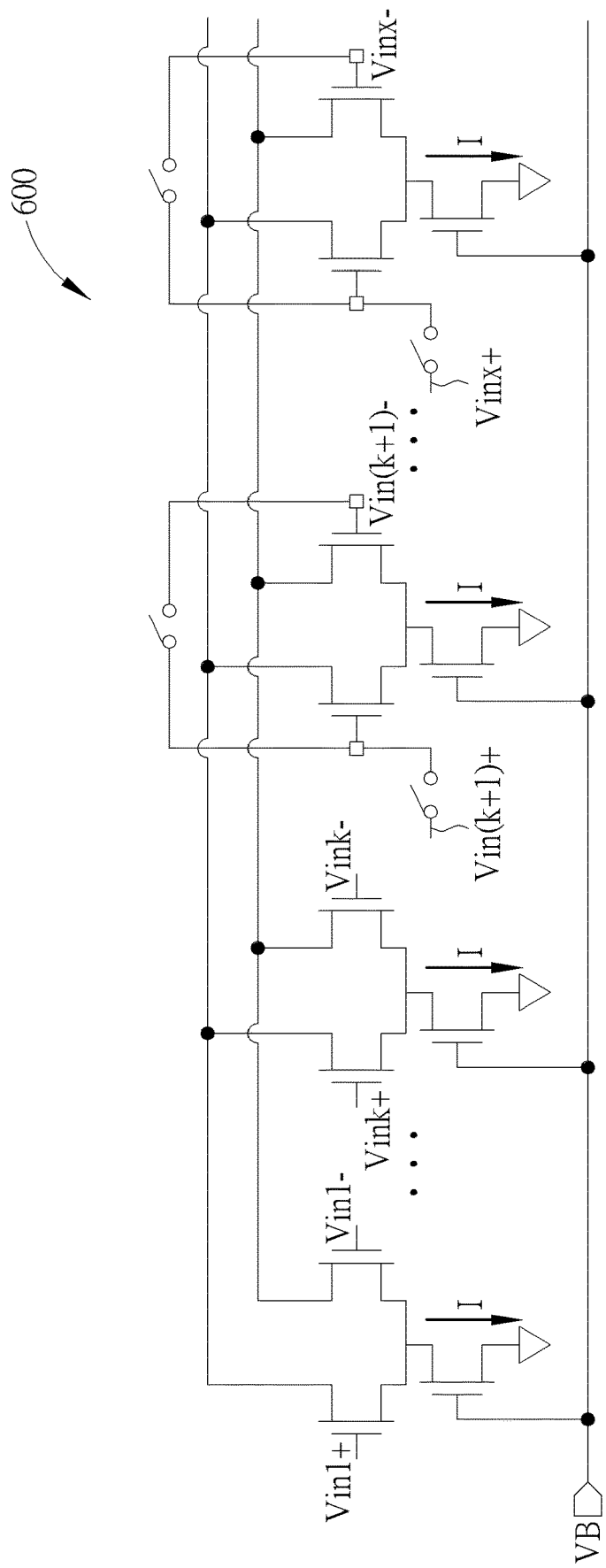
FIGS. 6-9 are schematic diagrams of input stage circuits of S-OPs according to embodiments of the present invention.

The capacitance decreasing scheme realized by switching the coupling of differential input pairs may also be applied to the input stage circuit having different circuit structures. Please refer to FIG. 6, which is a schematic diagram of an input stage circuit 600 of an S-OP according to an embodiment of the present invention. As shown in FIG. 6, the input stage circuit 600 includes multiple (x) differential input pairs, among which several (k) differential input pairs are deployed without switching configurations and other (x-k) differential input pairs are deployed with switches (where k is smaller than x). Therefore, during the display line period where the input data voltage changes, these (x-k) differential input pairs may be configured to operate in the speed-up driving mode; that is, the gate terminal of the positive input transistor of the (x-k) differential input pairs is coupled to the gate terminal of the corresponding negative input transistor. When the input data voltage is settled, the (x-k) differential input pairs may be configured to operate in the normal driving mode; that is, the gate terminal of the positive input transistor of the (x-k) differential input pairs is coupled to the corresponding input terminal.

Since the negative input transistors are further coupled to the output terminal of the S-OP, the driving capability of the S-OP may be used to charge or discharge the parasitic capacitance of these differential input pairs. Therefore, during the display line period, the number of positive input transistors coupled to the output terminal of the RDAC may be reduced; hence, the parasitic capacitance at the output terminal of the RDAC may be significantly reduced, so as to accelerate the charging and discharging to the parasitic capacitance of the output terminal of the RDAC and reduce the RC delay.

Figure 7:
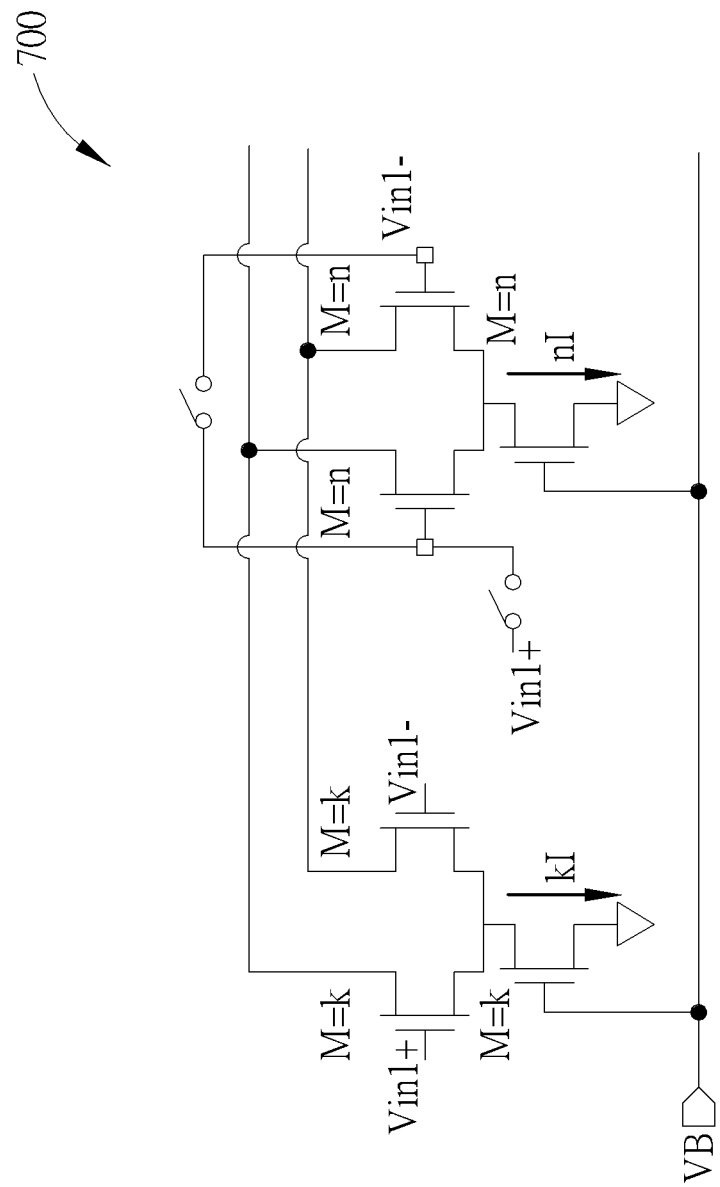

Please refer to FIG. 7, which is a schematic diagram of an input stage circuit 700 of an S-OP according to an embodiment of the present invention. FIG. 7 illustrates that one differential input pair includes multiple input transistor pairs configured to be coupled to the same positive input terminal (for receiving the input data voltage Vin1+), while their negative gate terminals are coupled to the output terminal of the S-OP. Among the differential input pair, there are n sets of input transistor pairs (M=n) deployed with switches and k sets of input transistor pairs (M=k) deployed without switching configurations. Therefore, during the display line period where the input data voltage changes, the n sets of input transistor pairs may be configured to operate in the speed-up driving mode, where the gate terminal of the positive input transistor is coupled to the gate terminal of the corresponding negative input transistor. When the input data voltage is settled, the n sets of input transistor pairs may be configured to operate in the normal driving mode, where the gate terminal of the positive input transistor is coupled to the corresponding input terminal. In this embodiment, the currents supplied to the differential input pairs are allocated to the input transistor pairs with a ratio identical to the number of input transistor pairs (i.e., kI and nI).

Since the negative input transistors are further coupled to the output terminal of the S-OP, the driving capability of the S-OP may be used to charge or discharge the parasitic capacitance of these input transistor pairs. Therefore, during the display line period, only several of the input transistor pairs are coupled to the output terminal of the RDAC; hence, the parasitic capacitance at the output terminal of the RDAC may be significantly reduced, so as to accelerate the charging and discharging to the parasitic capacitance of the output terminal of the RDAC and reduce the RC delay.

Figure 8:
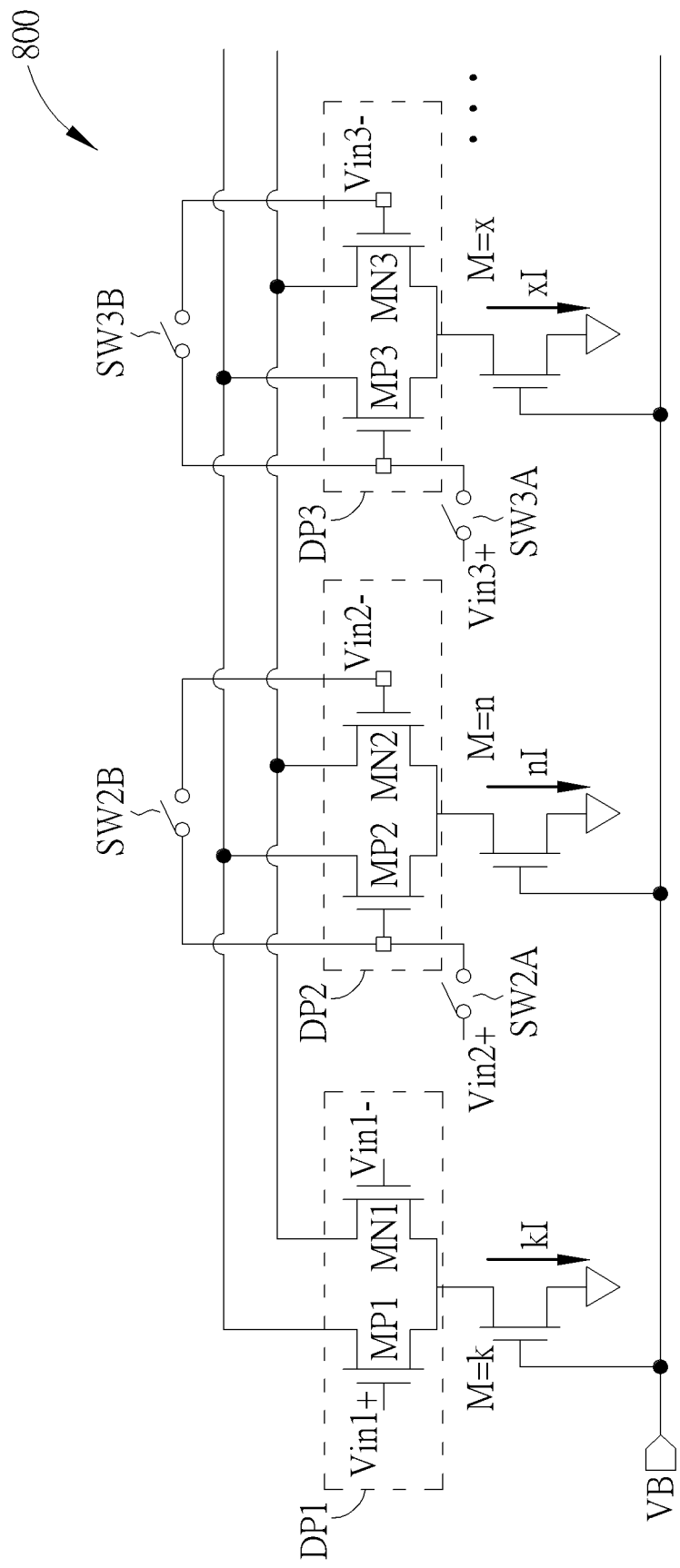

In the above embodiment, each differential input pair or each input transistor pair is configured to receive the same bias current value. Those skilled in the art should understand that the bias current or tail current may be configured arbitrarily. For example, please refer to FIG. 8, which is a schematic diagram of an input stage circuit 800 of an S-OP according to an embodiment of the present invention. As shown in FIG. 8, the circuit structure of the input stage circuit 800 is similar to the circuit structure of the input stage circuit 300, so signals and elements having similar functions are denoted by the same symbols. The difference between the input stage circuit 800 and the input stage circuit 300 is that, each of the differential input pairs DP1-DP3 in the input stage circuit 800 receives different magnitudes of bias currents (i.e., kI, nI and xI). The different current magnitudes may be realized by deploying different number of transistors (i.e., M=k, M=n and M=x) in the current sources of the differential input pairs DP1-DP3. Different current values may be served as weighting parameters for performing interpolation to increase the resolution of output data voltage. In this embodiment, the differential input pairs DP2 and DP3 may operate in the normal driving mode or the speed-up driving mode under the controls of the switches SW2A, SW2B, SW3A and SW3B. The detailed operations are illustrated in the above paragraphs and will not be narrated herein.

Figure 9:
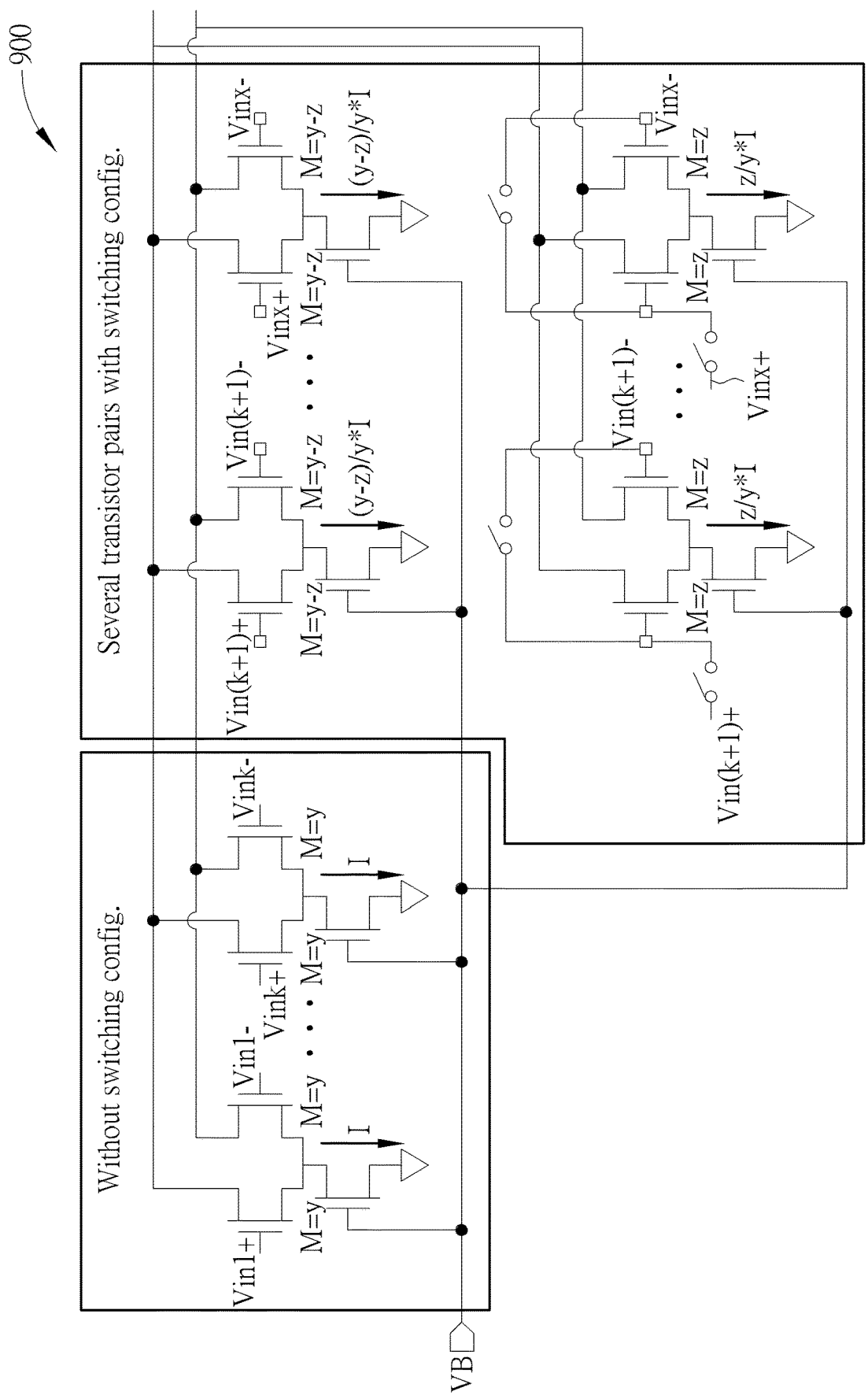

Please refer to FIG. 9, which is a schematic diagram of an input stage circuit 900 of an S-OP according to an embodiment of the present invention. As shown in FIG. 9, the input stage circuit 900 includes multiple (x) differential input pairs, and each differential input pair has y sets of input transistor pairs (i.e., M=y). Among the x differential input pairs, k differential input pairs are deployed without switching configurations (where k is smaller than x). Among the rest (x-k) differential input pairs, there are z sets of input transistor pairs (M=z) deployed with switches and other (y-z) sets of input transistor pairs (M=y-z) deployed without switching configurations (where z is smaller than y). Therefore, during the display line period where the input data voltage changes, the z sets of input transistor pairs may be configured to operate in the speed-up driving mode where the gate terminal of the positive input transistor is coupled to the gate terminal of the corresponding negative input transistor. When the input data voltage is settled, the z sets of input transistor pairs may be configured to operate in the normal driving mode where the gate terminal of the positive input transistor is coupled to the corresponding input terminal.

Since the negative input transistors are further coupled to the output terminal of the S-OP, the driving capability of the S-OP may be used to charge or discharge the parasitic capacitance of these differential input pairs. Therefore, during the display line period, only several of the input transistor pairs are coupled to the output terminal of the RDAC; hence, the parasitic capacitance at the output terminal of the RDAC may be significantly reduced, so as to accelerate the charging and discharging to the parasitic capacitance of the output terminal of the RDAC and reduce the RC delay.

In the embodiment as shown in FIG. 9, each current source receives the same bias voltage VB, so as to generate the same bias current value I for each differential input pair. As for the (x-k) differential input pairs, since several input transistor pairs are deployed with switching configurations and several input transistor pairs are deployed without switching configurations, the bias current value I supplied to these differential input pairs may also be allocated with the same ratio, i.e., (y-z)/y*I and z/y*I, to be adapted to the number of input transistor pairs.

Please note that the present invention aims at providing a capacitance decreasing scheme for an operational amplifier. Those skilled in the art may make modifications and alternations accordingly. For example, in the above embodiments, the operational amplifier is applied as an S-OP for receiving data voltages from the RDAC. However, the differential input pair of the present invention is not limited to a differential input pair in the S-OP, and the previous stage of the operational amplifier is not limited to a Gamma voltage generation circuit. In fact, the operational amplifier of the present invention is widely applicable to any situation that needs to reduce the parasitic capacitance of the differential input pair, so as to prevent the excessively large RC delay generated from large loading of passive elements, active elements and signal wires together with the parasitic capacitance of the differential input pair, or an excessively slow slew rate due to insufficient driving capability of the previous stage circuit. As long as one or more differential input pairs or input transistor pairs are switched to couple the positive gate terminal to the corresponding negative gate terminal and isolate the positive input transistor from the input terminal to reduce the parasitic capacitance at the output terminal of the previous stage, the related implementations, operations and applications all belong to the scope of the present invention.

It should be noted that it is preferable to couple the gate terminal of the positive input transistor to the gate terminal of the corresponding negative input transistor when it is disconnected from the input terminal. More specifically, the embodiments of the present invention aim at reducing the parasitic capacitance at the input terminal of the operational amplifier and the output terminal of the previous stage circuit, and disconnection of the gate terminal of the positive input transistor from the input terminal can server this purpose. In such a situation, this gate terminal may be floating if it is not connected with any other nodes; hence, the voltage at this gate terminal may be unpredictable. If the voltage at the gate terminal of the positive input transistor is far away from the target output data voltage level of the operational amplifier, charge sharing may occur when the differential input pair returns to the normal driving mode and this gate terminal is reconnected to the input terminal, causing an abnormal voltage drop or voltage spike appearing at the input terminal and the output terminal of the operational amplifier. Therefore, it is preferable to couple the gate terminal of the positive input transistor to the gate terminal of the corresponding negative input transistor in the speed-up driving mode, so that the powerful driving capability of the operational amplifier is able to pull the voltage of the input gate terminal toward the target voltage level.

Further, it should also be noted that the implementation of controlling the positive gate terminal to be short-circuited to the negative gate terminal of the differential input pair may reduce the charging/discharging capability of the S-OP. For example, in an embodiment where the input stage circuit has three differential input pairs configured to receive the same bias current magnitude, one differential input pair is normally coupled to the input terminal and the other two differential input pairs are configured to couple the gate terminals of the positive input transistor and the negative input transistor together in the speed-up driving mode. In such a situation, the charging/discharging capability of the S-OP may be decreased to one-third of original.

Figure 10A:
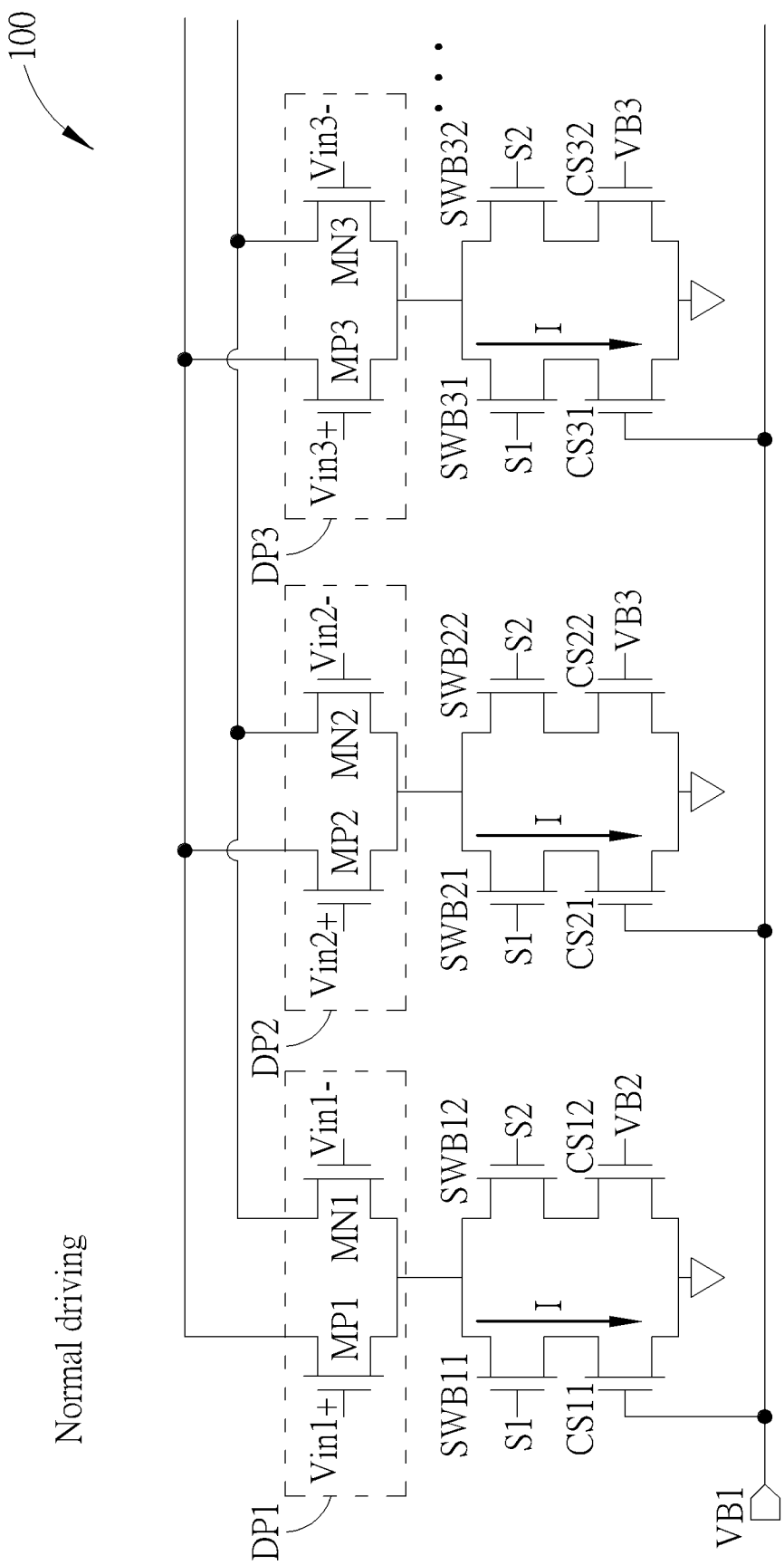
FIGS. 10A and 10B are schematic diagrams of an input stage circuit of an S-OP according to an embodiment of the present invention.
Figure 10B:
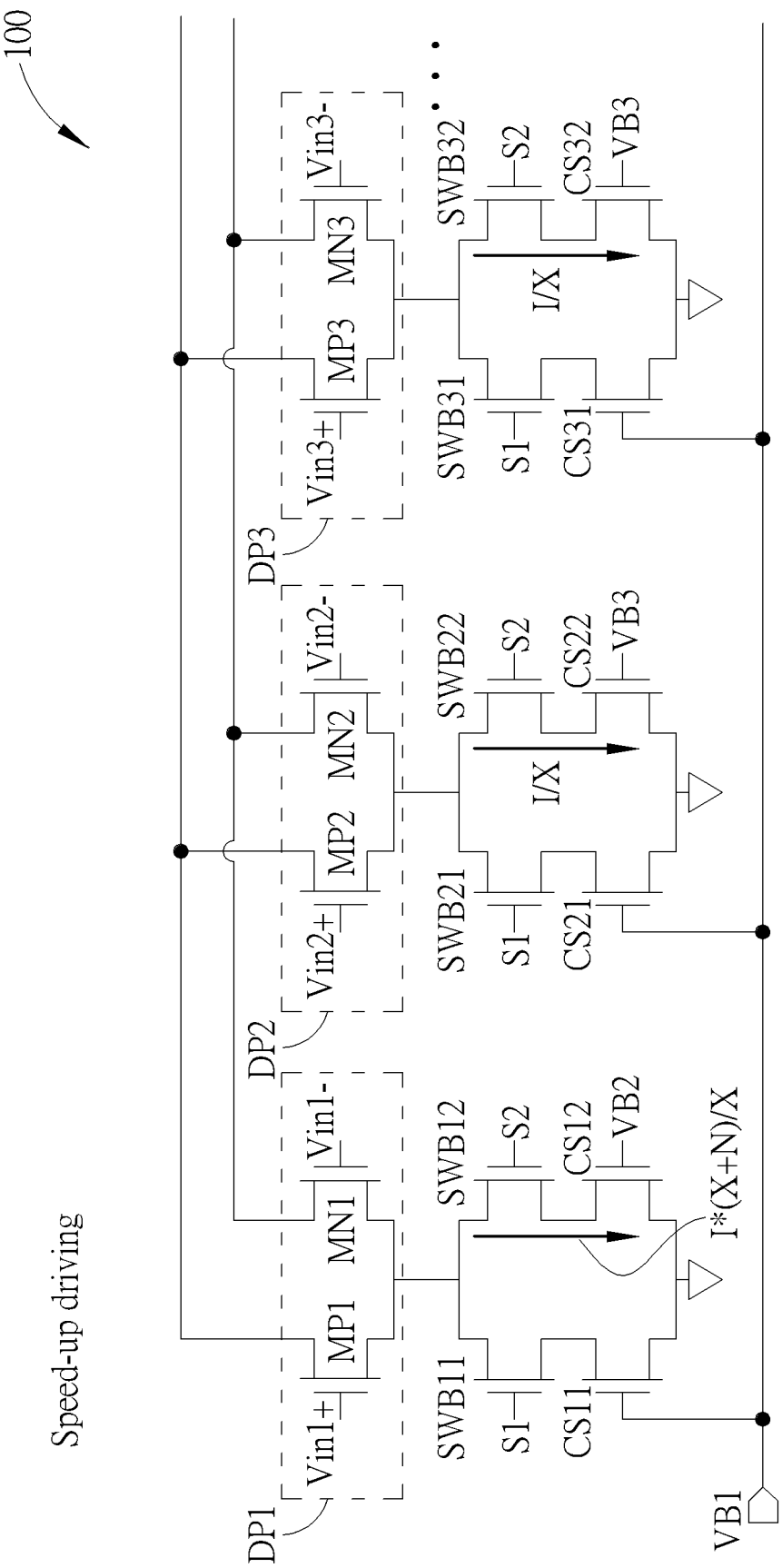

In an embodiment, the bias currents of the differential input pairs may be configured or adjusted to solve this problem. Please refer to FIGS. 10A and 10B, which are schematic diagrams of an input stage circuit 100 of an S-OP according to an embodiment of the present invention. As shown in FIGS. 10A and 10B, the input stage circuit 100 includes multiple differential input pairs, among which three differential input pairs DP1-DP3 are shown. The differential input pair DP1, composed of input transistors MP1 and MN1, is operated without switching configurations, where the gate terminal of the input transistor MP1 is coupled to the input terminal of the S-OP and the gate terminal of the input transistor MN1 is coupled to the output terminal of the S-OP (omitted herein for brevity). The differential input pair DP2 is composed of input transistors MP2 and MN2, and the differential input pair DP3 is composed of input transistors MP3 and MN3. The differential input pairs DP2 and DP3 are operated with switching configurations, as being implemented with switches similar to those illustrated in FIG. 3 (omitted herein for brevity).

In addition, the differential input pair DP1 receives current supply from a current source, which is implemented with transistors CS11 and CS12 respectively coupled to switches SWB11 and SWB12. The switches SWB11 and SWB12 are controlled by control signals S1 and S2, respectively. The transistors CS11 and CS12 receive bias voltages VB1 and VB2, respectively, for providing different current magnitudes. The differential input pair DP2 receives current supply from a current source, which is implemented with transistors CS21 and CS22 respectively coupled to switches SWB21 and SWB22. The switches SWB21 and SWB22 are controlled by the control signals S1 and S2, respectively. The transistors CS21 and CS22 receive bias voltages VB1 and VB3, respectively, for providing different current magnitudes. The differential input pair DP3 receives current supply from a current source, which is implemented with transistors CS31 and CS32 respectively coupled to switches SWB31 and SWB32. The switches SWB31 and SWB32 are controlled by the control signals S1 and S2, respectively. The transistors CS31 and CS32 receive bias voltages VB1 and VB3, respectively, for providing different current magnitudes.

FIG. 10A illustrates a normal driving mode where the gate terminal of the positive input transistor in each of the differential input pairs DP1-DP3 is coupled to the corresponding input terminal. In the normal driving mode, the switches SWB11, SWB21 and SWB31 controlled by the control signal S1 are turned on, allowing the current source to supply the same bias current value I to the differential input pairs DP1-DP3.

FIG. 10B illustrates a speed-up driving mode where the gate terminal of the positive input transistor in the differential input pairs DP2-DP3 is coupled to the gate terminal of the corresponding negative input transistor. Therefore, only the gate terminal of the positive input transistor in the differential input pair DP1 is coupled to the input terminal of the S-OP, in order to reduce the parasitic capacitance of the input terminal. In the speed-up driving mode, the switches SWB12, SWB22 and SWB32 controlled by the control signal S2 are turned on, allowing the current source to supply different bias current values to the differential input pairs DP1-DP3. In this embodiment, the bias current value for the differential input pair DP1 is I*(X+N)/X, and the bias current value for the differential input pairs DP2 and DP3 is I/X, where X and N are positive integers.

Therefore, in the speed-up driving mode, the gate terminals of the input transistor pairs in the differential input pairs DP2-DP3 are coupled to each other, such that the bias currents or tail currents for these differential input pairs DP2-DP3 cannot provide charging/discharging capability for the S-OP since the gate terminals of the positive input transistor and the negative input transistor are forced to be in the same voltage level. In other words, there is only one differential input pair DP1 capable of charging/discharging capability for the S-OP. In such a situation, the magnitude of the bias current received by the differential input pair DP1 may be increased, in order to provide enough charging/discharging capability in the speed-up driving mode. Correspondingly, the bias current received by the differential input pairs DP2 and DP3 may be decreased to a lower value as compared to the normal driving mode.

Please note that the current values determined based on the parameters N and X are merely an example. In fact, the current may be configured or adjusted in any feasible manner. As long as the differential input pair DP1 is configured to receive a bias current value in the speed-up driving mode greater than the bias current value received in the normal driving mode, the charging/discharging capability under the speed-up driving operations can be kept at a higher level. In the embodiment shown in FIGS. 10A and 10B, different current values may be realized by applying different bias voltages to the current sources. In another embodiment, different current values may be realized by using different quantities of transistors in each current source or by changing the sizes of the transistors.

In another embodiment, the problem of lower charging/discharging capability caused by coupling of the negative gate terminal and the positive gate terminal may also be solved by applying a voltage difference between the gate terminal of the positive input transistor and the gate terminal of the negative input transistor when they are coupled to each other.

Figure 1:
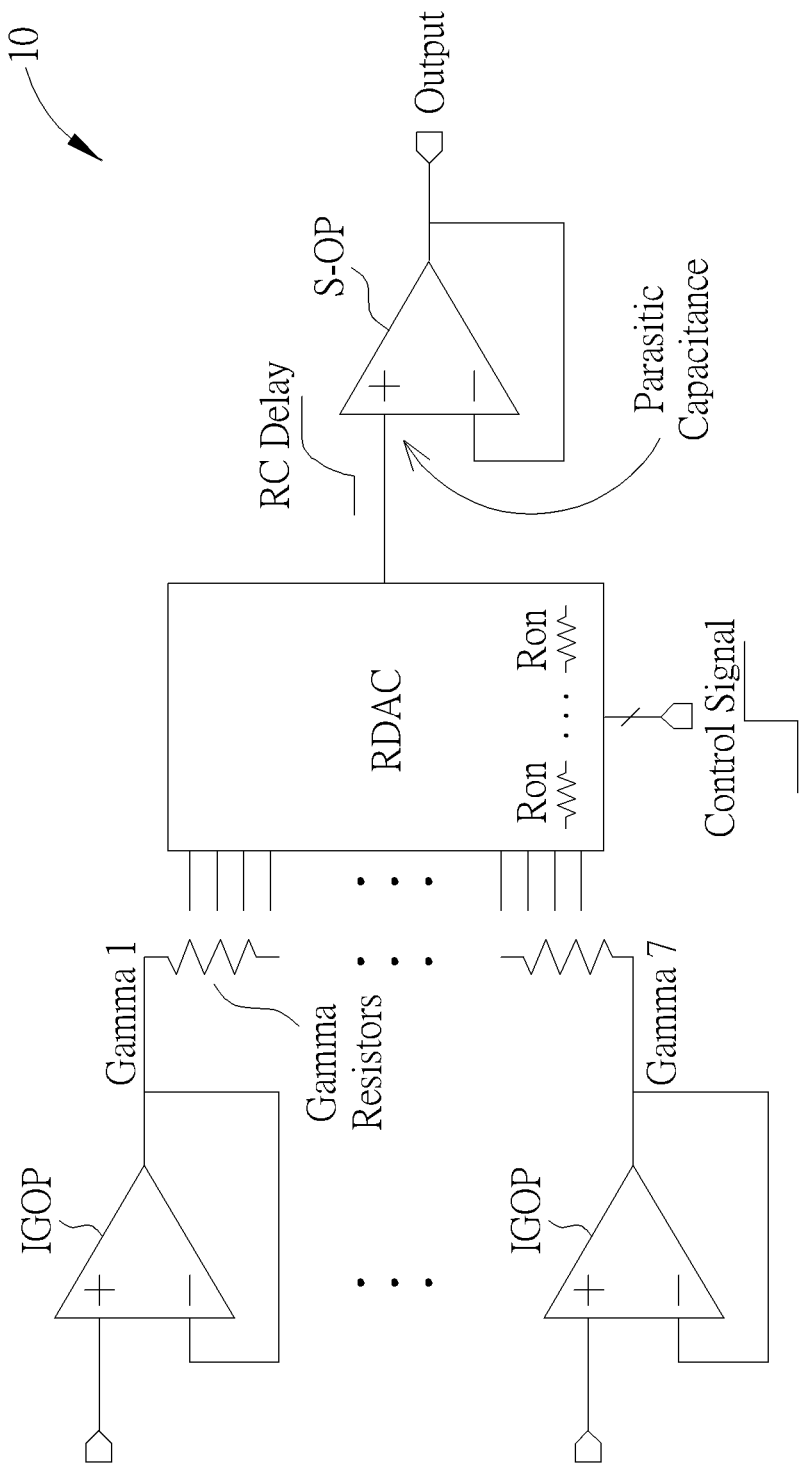
FIG. 1 is a schematic diagram of a source driver circuit.
Figure 2:
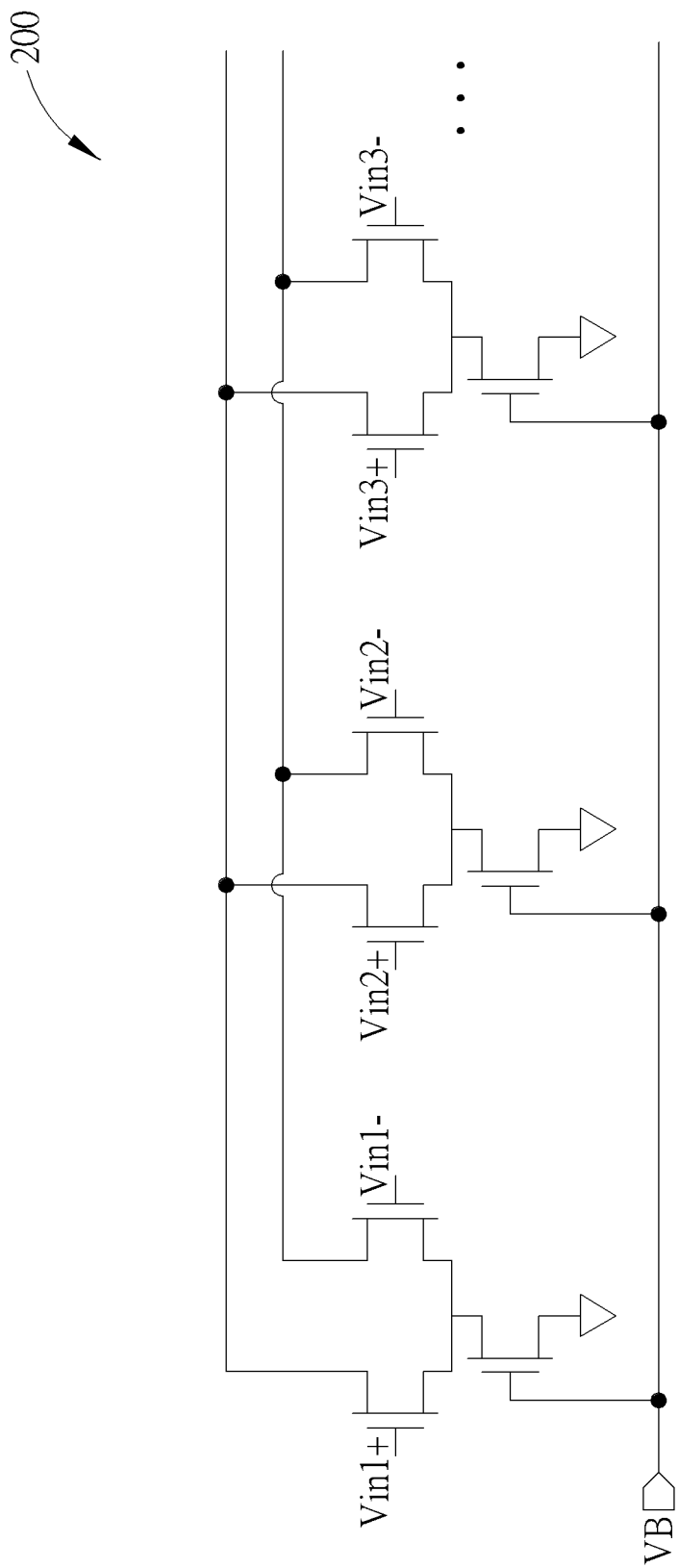
FIG. 2 illustrates multiple differential input pairs in an input stage circuit of a conventional S-OP.
Figure 11:
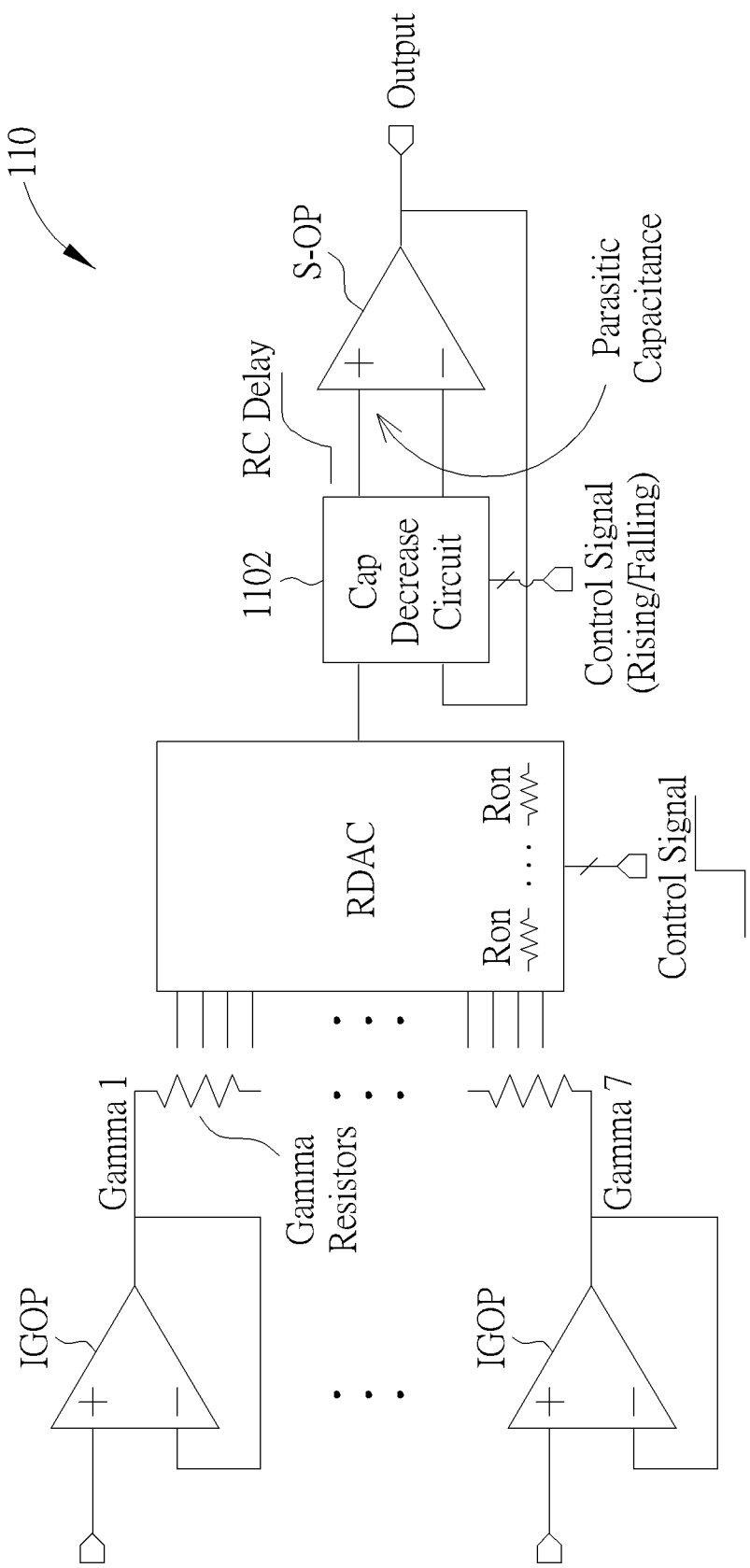
FIG. 11 is a schematic diagram of a source driver circuit according to an embodiment of the present invention.

Please refer to FIG. 11, which is a schematic diagram of a source driver circuit 110 according to an embodiment of the present invention. As shown in FIG. 11, the source driver circuit 110 is similar to the source driver circuit 10 shown in FIG. 1, so signals and elements having similar functions are denoted by the same symbols. The difference between the source driver circuit 110 and the source driver circuit 10 is that, the source driver circuit 110 further includes a capacitance decreasing circuit 1102, which is coupled between the RDAC and the S-OP.

Figure 12:
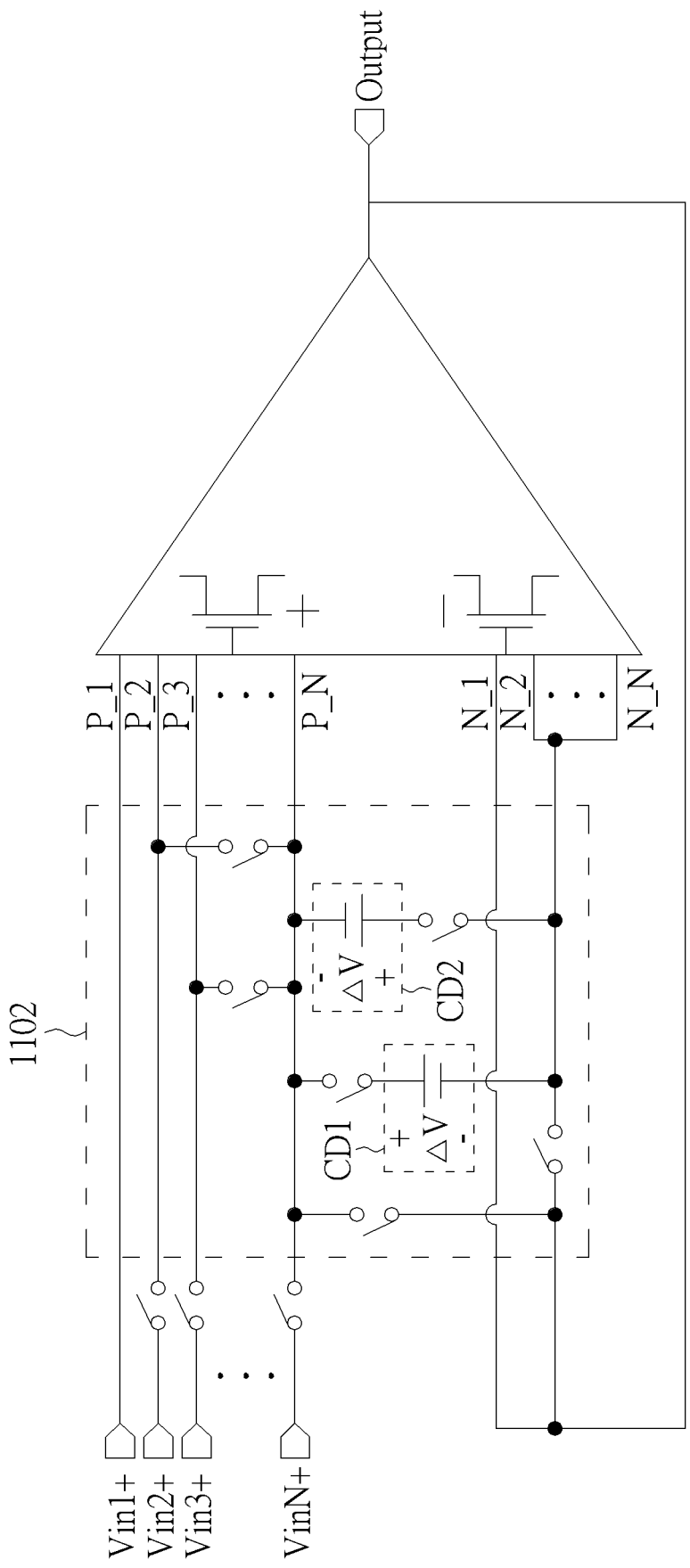
FIG. 12 illustrates an exemplary schematic diagram of the capacitance decreasing circuit shown in FIG. 11.

FIG. 12 illustrates an exemplary schematic diagram of the capacitance decreasing circuit 1102, where the S-OP is also shown for illustration. As shown in FIG. 12, the S-OP includes N positive input terminals P_1-P_N, N negative input terminals N)1-N_N and an output terminal. The positive input terminals P_1-P_N are coupled to the RDAC through the capacitance decreasing circuit 1102, and the negative input terminals N_1-N_N are coupled to the output terminal of the S-OP through the capacitance decreasing circuit 1102. The capacitance decreasing circuit 1102 includes multiple switches and clamp devices, where the switches are served to control the positive input terminals P_1-P_N of the S-OP to be coupled to the RDAC or the corresponding negative input terminals N_1-N_N of the S-OP, and the clamp devices are served to generate the voltage difference ΔV between the positive input terminals P_1-P_N and their corresponding negative input terminals N_1-N_N.

Please note that the switches in the capacitance decreasing circuit 1102 operate similarly as the switches in the input stage circuit of S-OP as described in the above embodiments. To facilitate the illustration, FIG. 12 shows that the switches are included in the capacitance decreasing circuit 1102, as a module independent of the S-OP; hence, the S-OP only includes multiple differential input pairs, and thus the positive input terminals P_1-P_N and the negative input terminals N_1-N_N shown in FIG. 12 refer to the gate terminal of the positive input transistor and the gate terminal of the negative input transistor in each differential input pair, respectively. In another embodiment, the capacitance decreasing circuit 1102 may be integrated into the S-OP or its input stage circuit. In consideration of the situation where the capacitance decreasing circuit 1102 is integrated into the S-OP, the nodes of the capacitance decreasing circuit 1102 coupled to the RDAC may be regarded as the input terminals of the S-OP.

FIG. 12 shows that the S-OP has N differential input pairs, where only one differential input pair is deployed without switching configurations and other differential input pairs are deployed with switching configurations (i.e., coupled to the switches in the capacitance decreasing circuit 1102). In detail, as for the $1^{st}$ differential input pair, the positive input terminal P_1 is coupled to the RDAC for receiving the input data voltage Vin1+, and the negative input terminal N_1 is coupled to the output terminal of the S-OP. As for other differential input pairs, the negative input terminals N_2-N_N are coupled to the output terminal of the S-OP commonly, and the positive input terminals P_2-P_N may be selectively coupled to the RDAC (for receiving the input data voltages Vin2+, Vin3+, . . . VinN+) or coupled to the corresponding negative input terminals N_2-N_N.

More specifically, with the switching configurations in the capacitance decreasing circuit 1102, each of the positive input terminals P_2-P_N is coupled to the RDAC through a switch. The negative input terminals N_2-N_N are coupled together, and further coupled to the output terminal of the S-OP through a switch. In addition, the positive input terminals P_2-P_(N−1) are respectively coupled to the positive input terminal P_N through a switch. The positive input terminal P_N is further coupled to the output terminal of the S-OP through a switch and coupled to the common node of the negative input terminals N_2-N_N through two paths. Each of the two paths includes a switch and a clamp device CD1 or CD2. On one path, the clamp device CD1 may form a voltage difference ΔV to cause that the voltage of the positive input terminals P_2-P_N is greater than the voltage of the negative input terminals N_2-N_N. On the other path, the clamp device CD2 may form a voltage difference ΔV to cause that the voltage of the negative input terminals N_2-N_N is greater than the voltage of the positive input terminals P_2-P_N, as shown in FIG. 12.

Therefore, during the display line period, the capacitance decreasing circuit 1102 may be configured to be operated in the speed-up driving mode; that is, the switches coupled between the positive input terminals P_2-P_N and the negative input terminals N_2-N_N may be turned on and the switches coupled between the positive input terminals P_2-P_N and the RDAC may be turned off. In such a situation, only the positive input terminal P_1 contributes parasitic capacitance to the output terminal of the RDAC, causing lower capacitive loading of the RDAC. During other periods, the capacitance decreasing circuit 1102 may be configured to be operated in the normal driving mode; that is, the switches coupled between the positive input terminals P_2-P_N and the RDAC may be turned on and the switches coupled between the positive input terminals P_2-P_N and the negative input terminals N_2-N_N may be turned off.

Figure 13A:
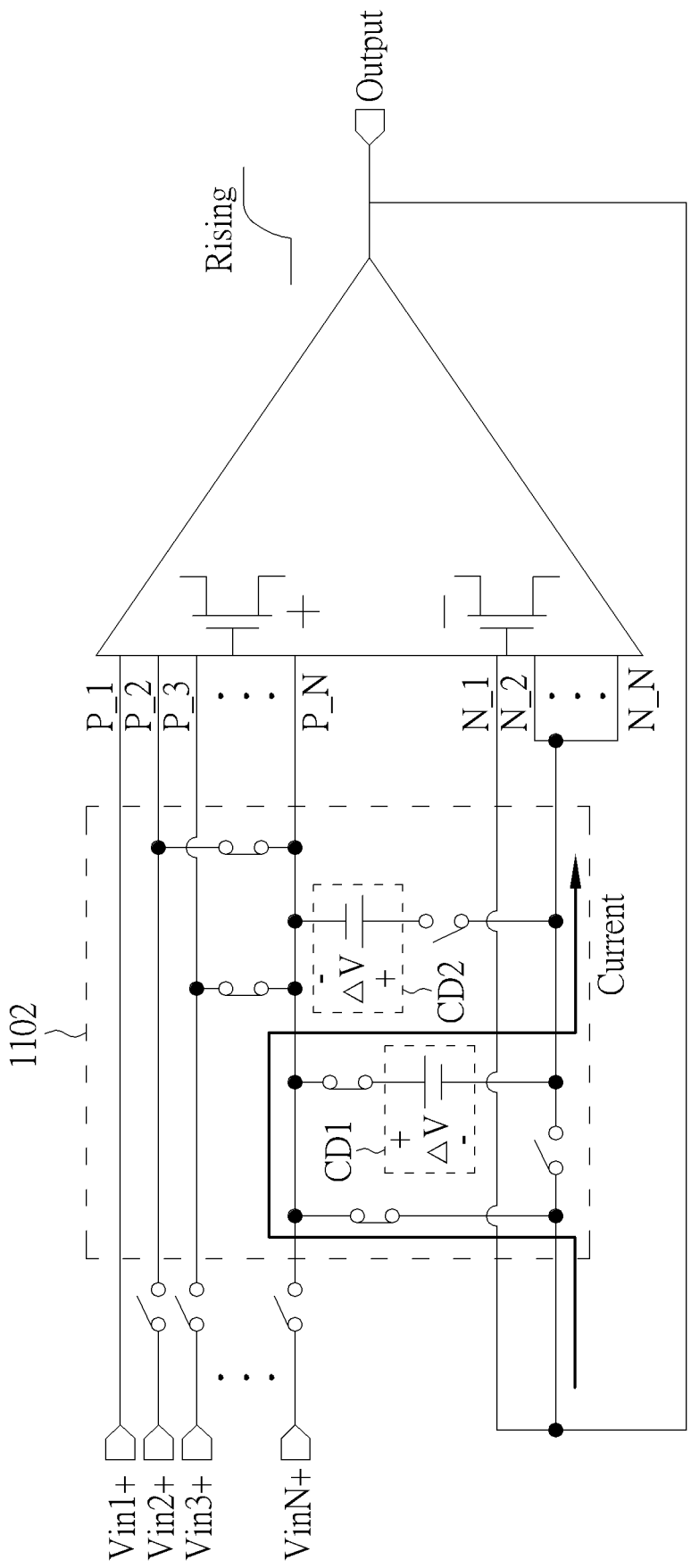
FIGS. 13A and 13B illustrate the detailed operations of the capacitance decreasing circuit during the display line period.
Figure 13B:
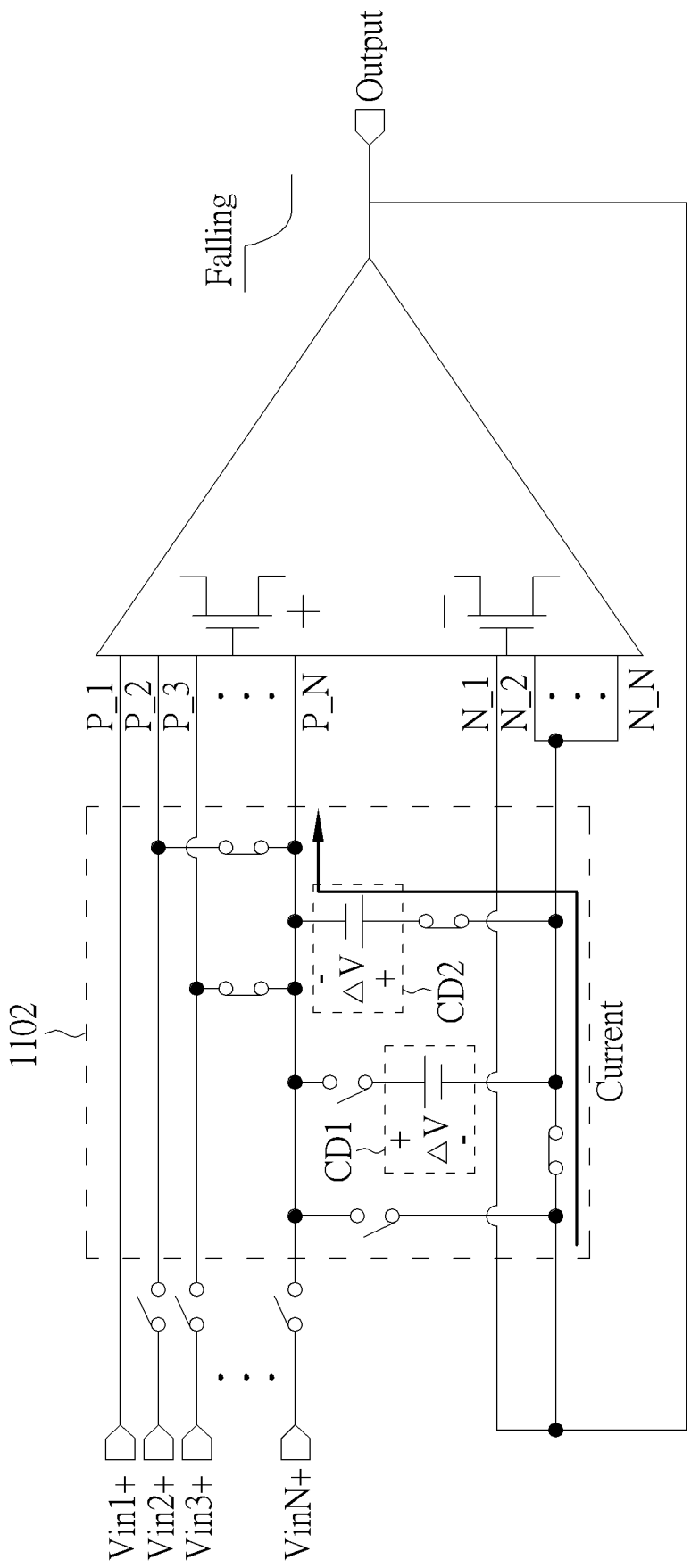

FIGS. 13A and 13B illustrate the detailed operations of the capacitance decreasing circuit 1102 during the display line period. In detail, FIG. 13A illustrates a rising time of the input data voltage in the display line period. FIG. 13B illustrates a falling time of the input data voltage in the display line period. The capacitance decreasing circuit 1102 may receive control signal(s) for controlling corresponding switches to be turned on or off in each of the rising time and the falling time.

As shown in FIG. 13A, during the rising time of the input data voltage, the switch coupled to the clamp device CD1 and the switch coupled between the positive input terminals P_2-P_N and the output terminal are turned on. In such a situation, a current may flow from the output terminal of the S-OP to the negative input terminals N_2-N_N through the positive input terminals P_2-P_N with the turned-on switches. With the deliberate positive voltage difference inserted between the positive input terminals P_2-P_N and the negative input terminals N_2-N_N (i.e., the voltage of the positive input terminals P_2-P_N is greater than the voltage of the negative input terminals N_2-N_N), the S-OP is configured with higher driving capability to charge the output terminal during the rising time.

As shown in FIG. 13B, during the falling time of the input data voltage, the switch coupled to the clamp device CD2 and the switch coupled between the negative input terminals N_2-N_N and the output terminal are turned on. In such a situation, a current may flow from the output terminal of the S-OP to the positive input terminals P_2-P_N through the negative input terminals N_2-N_N with the turned-on switches. With the deliberate negative voltage difference inserted between the positive input terminals P_2-P_N and the negative input terminals N_2-N_N (i.e., the voltage of the positive input terminals P_2-P_N is less than the voltage of the negative input terminals N_2-N_N), the S-OP is configured with higher driving capability to discharge the output terminal during the falling time.

Therefore, during the rising time or the falling time of the input data voltage, the transconductance and the slew rate of the S-OP can be maintained at a satisfactory level even if several differential input pairs are not configured to receive the input data voltage. As a result, the parasitic capacitance at the output terminal of the RDAC may be reduced while the charging/discharging capability of the S-OP is maintained, which significantly reduces the RC delay and improves the output slew rate (rising/falling time) of the overall system.

Figure 14:
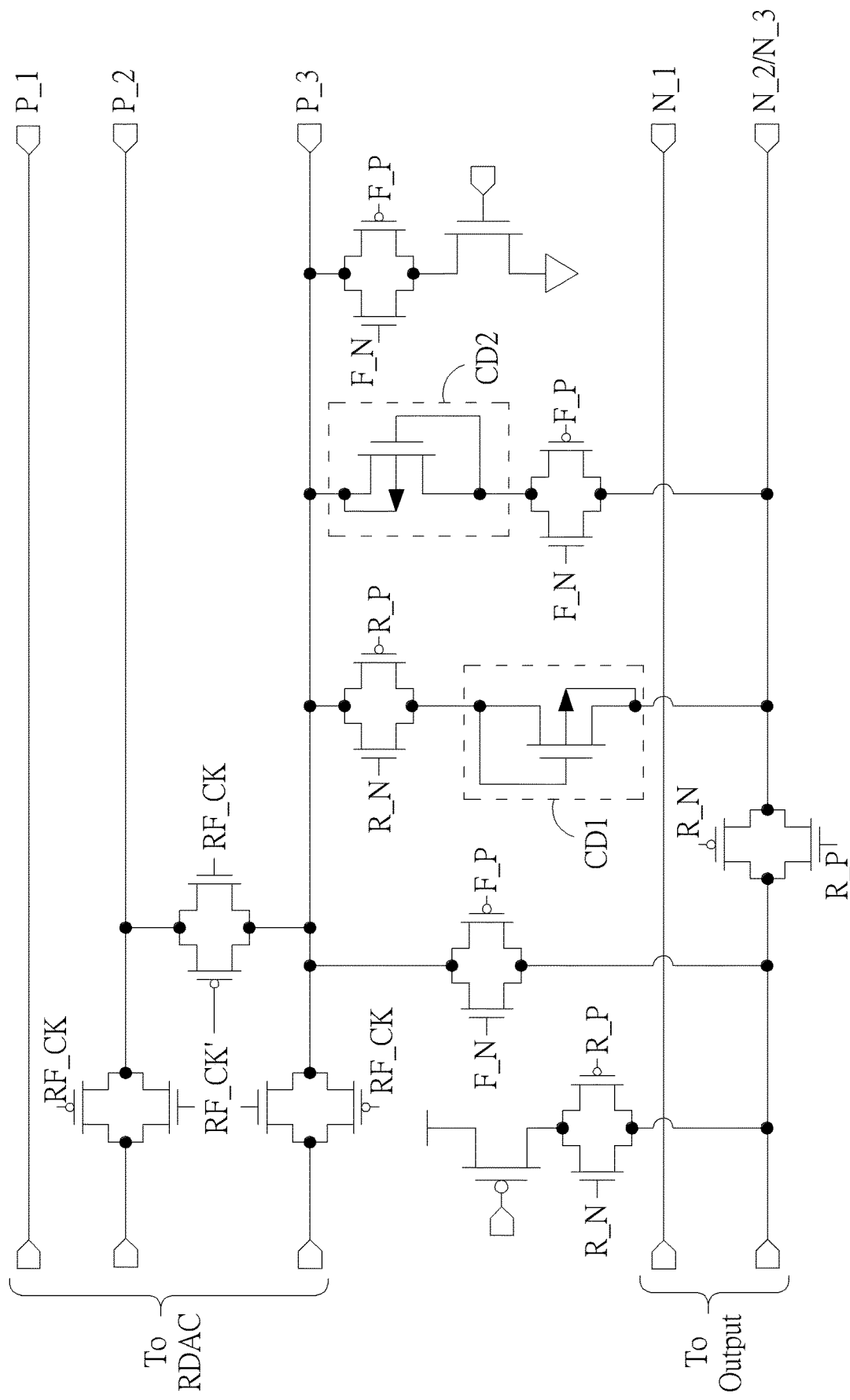
FIG. 14 illustrates a practical circuit diagram of the capacitance decreasing circuit.
Figure 15:
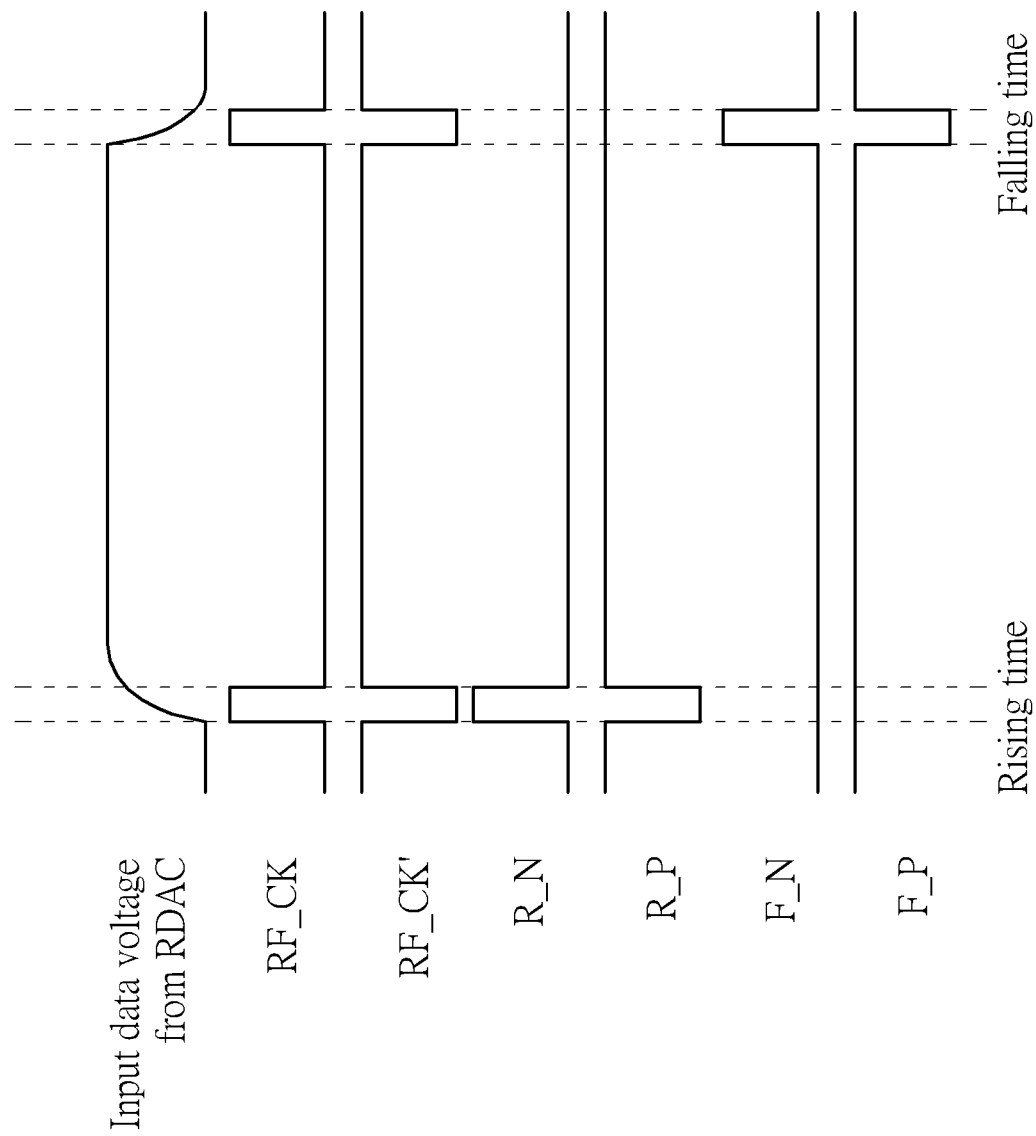
FIG. 15 is a waveform diagram of the related control signals of the capacitance decreasing circuit.

FIG. 14 illustrates a practical circuit diagram of the capacitance decreasing circuit 1102 applicable to an S-OP having 3 positive input terminals P_1-P_3 and 3 negative input terminals N_1-N_3, i.e., 3 differential input pairs. Note that each of the switches may be implemented with a transmission gate composed of an NMOS transistor and a PMOS transistor, and each of the clamp devices CD1 and CD2 may be implemented with a diode or diode-connected transistor. The diode or diode-connected transistor may form a voltage difference approximately equal to 0.7V. FIG. 15 is a waveform diagram of the related control signals of the capacitance decreasing circuit 1102 shown in FIG. 14. As shown in FIG. 15, the control signals RF_CK and RF_CK' enable the speed-up driving mode during both the rising time and the falling time. The control signals R_N and R_P turn on the corresponding switches during the rising time, and the control signals F_N and F_P turn on the corresponding switches during the falling time.

To sum up, the embodiments of the present invention provide a capacitance decreasing scheme for an operational amplifier. The capacitance decreasing scheme may be implemented in the input stage circuit of the operational amplifier, or implemented in a capacitance decreasing circuit coupled to the input terminal of the operational amplifier. In an embodiment, the operational amplifier may be implemented as an output buffer, such as an S-OP in a source driver. With the capacitance decreasing scheme, a switch may be coupled between the gate terminal of the positive input transistor and the corresponding input terminal, and a switch may be coupled between the gate terminal of the positive input transistor and the gate terminal of the corresponding negative input transistor in the differential input pair. Therefore, the gate terminal of the positive input transistor may be selectively coupled to the input terminal for receiving an input data voltage (as the normal driving mode), or coupled to the gate terminal of the negative input transistor for reducing the parasitic capacitance at the positive input terminal (as the speed-up driving mode). In an embodiment, the speed-up driving mode may be operated during the display line period where the input data voltage of the operational amplifier changes. As a result, during the display line period, there may be only one or few differential input pairs coupled to the output terminal of the previous stage, leading to significant reduction of the parasitic capacitance, which thereby reduces the RC delay and improves the signal propagation performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier for being used as an output buffer of a source driver of a display panel, comprising:
 a plurality of differential input pairs, for receiving at least one input data voltage for generating an output data voltage output to the display panel, wherein a first differential input pair of the plurality of differential input pairs comprises:
  a first input transistor, having a gate terminal coupled to an output terminal of the operational amplifier; and
  a second input transistor, having a gate terminal;
 a first switch, coupled between the gate terminal of the first input transistor and the gate terminal of the second input transistor, configured to control the gate terminal of the first input transistor and the gate terminal of the second input transistor to be connected to each other or not; and
 a second switch, coupled between a first input terminal of the operational amplifier and the gate terminal of the second input transistor;
 wherein a second differential input pair of the plurality of differential input pairs comprises:
  a fifth input transistor, having a gate terminal coupled to the output terminal of the operational amplifier; and
  a sixth input transistor, having a gate terminal coupled to the first input terminal or a second input terminal of the operational amplifier without through any switch.

2. The operational amplifier of claim 1, wherein the first switch is turned off and the second switch is turned on in a first driving mode, and the first switch is turned on and the second switch is turned off in a second driving mode.

3. The operational amplifier of claim 2, wherein the gate terminal of the second input transistor is coupled to the first input terminal of the operational amplifier in the first driving mode and the gate terminal of the second input transistor is coupled to the gate terminal of the first input transistor in the second driving mode.

4. The operational amplifier of claim 2, wherein the first switch and the second switch are operated in the second driving mode during at least one of a rising time and a falling time in a display line period.

5. The operational amplifier of claim 1, wherein the first differential input pair further comprises:
 a third input transistor, having a gate terminal coupled to the output terminal of the operational amplifier; and
 a fourth input transistor, having a gate terminal coupled to the first input terminal of the operational amplifier.

6. The operational amplifier of claim 1, wherein the plurality of differential input pairs further comprise a third differential input pair, the third differential input pair comprising:
 a seventh input transistor, having a gate terminal coupled to the output terminal of the operational amplifier; and
 an eighth input transistor, having a gate terminal;
 and wherein the operational amplifier further comprises:
  a third switch, coupled between the gate terminal of the seventh input transistor and the gate terminal of the eighth input transistor; and
  a fourth switch, coupled between a third input terminal of the operational amplifier and the gate terminal of the eighth input transistor.

7. The operational amplifier of claim 1, wherein the first differential input pair is configured to receive a first bias current when the gate terminal of the second input transistor is coupled to the first input terminal of the operational amplifier, and receive a second bias current when the gate terminal of the second input transistor is coupled to the gate terminal of the first input transistor;
 wherein a value of the first bias current is greater than a value of the second bias current.

8. The operational amplifier of claim 7, wherein the plurality of differential input pairs further comprise a fourth differential input pair coupled to a fourth input terminal of the operational amplifier, wherein the fourth differential input pair is configured to receive a third bias current when the gate terminal of the second input transistor is coupled to the first input terminal of the operational amplifier, and receive a fourth bias current when the gate terminal of the second input transistor is coupled to the gate terminal of the first input transistor;
 wherein a value of the fourth bias current is greater than a value of the third bias current.

9. The operational amplifier of claim 1, wherein the gate terminal of the second input transistor is coupled to the gate terminal of the first input transistor with a voltage difference between the gate terminal of the second input transistor and the gate terminal of the first input transistor.

10. The operational amplifier of claim 9, wherein the gate terminal of the second input transistor is coupled to the gate terminal of the first input transistor through a clamp device.

11. The operational amplifier of claim 10, wherein the clamp device comprises a diode or a diode-connected transistor.

12. The operational amplifier of claim 10, wherein the clamp device is configured to form the voltage difference between the gate terminal of the second input transistor and the gate terminal of the first input transistor.

13. The operational amplifier of claim 1, wherein the first differential input pair is coupled to a resistor-ladder digital-to-analog converter (RDAC) of a Gamma voltage generation circuit for the source driver.

* * * * *